(12) United States Patent
Chan et al.

(10) Patent No.: US 11,942,942 B1
(45) Date of Patent: Mar. 26, 2024

(54) HIGH-SPEED LEVEL-SHIFTER FOR POWER-CONVERSION APPLICATIONS

(71) Applicant: Hong Kong Applied Science and Technology Research Institute Company Limited, Hong Kong (HK)

(72) Inventors: Chit Sang Chan, Hong Kong (HK); Wei Qian, Hong Kong (HK); Ziyang Gao, Hong Kong (HK)

(73) Assignee: Hong Kong Applied Science and Technology Research Institute Company Limited, Hong Kong (HK)

( * ) Notice: Subject to any disclaimer, the term of this patent is extended or adjusted under 35 U.S.C. 154(b) by 11 days.

(21) Appl. No.: 18/057,316

(22) Filed: Nov. 21, 2022

(51) Int. Cl.
| | |
|---|---|
| *H03K 3/012* | (2006.01) |
| *H01L 29/06* | (2006.01) |
| *H01L 29/10* | (2006.01) |
| *H01L 29/78* | (2006.01) |
| *H03K 3/356* | (2006.01) |

(52) U.S. Cl.
CPC ......... *H03K 3/012* (2013.01); *H01L 29/0607* (2013.01); *H01L 29/1045* (2013.01); *H01L 29/7826* (2013.01); *H03K 3/356182* (2013.01)

(58) Field of Classification Search
None
See application file for complete search history.

(56) References Cited

U.S. PATENT DOCUMENTS

| | | | |
|---|---|---|---|
| 6,963,226 B2 | 11/2005 | Chiang | |
| 7,609,090 B2 | 10/2009 | Srivastava et al. | |
| 9,432,002 B2 | 8/2016 | Trivedi et al. | |
| 10,333,408 B1* | 6/2019 | Knoedgen | H02M 1/088 |
| 10,483,977 B1* | 11/2019 | Berwick | H03K 19/018521 |
| 10,566,975 B1 | 2/2020 | Tiwari et al. | |
| 11,881,759 B2* | 1/2024 | Bognanni | H02M 1/08 |

(Continued)

FOREIGN PATENT DOCUMENTS

| | | |
|---|---|---|
| CN | 108768145 A | 11/2018 |
| CN | 111130533 A | 5/2020 |

(Continued)

OTHER PUBLICATIONS

ISR and Written Opinion, PCT/CN2022/076523, dated Mar. 22, 2023.

*Primary Examiner* — Jeffrey S Zweizig
(74) *Attorney, Agent, or Firm* — Stuart T. Auvinen; gPatent LLC

(57) ABSTRACT

A level shifter circuit uses standard n-channel and p-channel transistors except for a pair of Lateral-Diffusion Metal-Oxide-Semiconductor (LDMOS) transistors that have an added lateral diffusion under the gate between the source and the conduction channel, increasing the breakdown voltage. The source of each LDMOS transistor connects to a drain of a transient differential transistor that has its gate driven by a oneshot that generates a pulse after an input transition. After the pulse ends a holding differential transistor draws a smaller bias current from the LDMOS transistors. The source of each LDMOS transistor connects to the drain and gate of a p-channel sensing transistor that drives gates of mirror transistors generating mirrored currents to cross-coupled n-channel mirror transistors that drive both terminals of a bistable latch that holds the output using a floating ground between driver transistors of a Buck converter switched by the bistable latch.

20 Claims, 10 Drawing Sheets

(56) References Cited

U.S. PATENT DOCUMENTS

2009/0027082 A1    1/2009   Kuge
2010/0201427 A1    8/2010   van den Berg et al.

FOREIGN PATENT DOCUMENTS

| | | |
|---|---|---|
| CN | 112073054 A | 12/2020 |
| CN | 113193865 A | 7/2021 |
| CN | 113472185 A | 10/2021 |
| CN | 114884502 A | 8/2022 |
| WO | WO2018212937 A1 | 11/2018 |

\* cited by examiner

HIGH-SPEED LEVEL-SHIFTER FOR POWER-CONVERSION APPLICATIONS

FIELD OF THE INVENTION

This invention relates to level-shifter circuits, and more particularly to high-speed low-power level shifter circuits.

BACKGROUND OF THE INVENTION

A Power management Integrated Circuit (PMIC) is an electronic component that provides a variety of power supplies at different voltages and current levels. These different voltages and current levels can be applied to industrial loads, such as Analog/Digital (A/D), D/A, Digital Signal Processors (DSP), Micro-Controller Units (MCU), motors, sensors, actuators, etc.

One of the circuits in a PMIC is a level shifter circuit. A level shifter may transfer an input signal from a low-voltage domain to a high-voltage domain, such as from 0-3 volts to 12-15 volts. The input and output signals may switch at high frequencies, such as 10 MHz. The level shifter output can be used to drive the gate of a large pull-up transistor in a synchronous buck converter as one example.

Level shifters can suffer from large propagation delays and high fabrication costs. FIG. 1 shows a prior-art level shifter. Input signal IN is applied to the gate of differential transistor 170 while the inverse input INB is applied to the gate of differential transistor 172. Differential transistors 170, 172 have their sources connected together to the lower supply of the high-voltage domain, VSSH, while their drains connect to the sources of middle transistors 160, 162 which have gates driven by bias voltage VBIAS.

The drains of middle transistors 160, 162 connect to the drains of high-voltage transistors 150, 152, which have their gates cross-coupled to their drains. One or both of the drain nodes may be buffered to generate the level-shifted output. The sources of high-voltage transistors 150, 152 connect to the high-voltage upper power supply VDDH.

Differential transistor 170, 172 may be standard n-channel transistors that can tolerate only a relatively low voltage. However, larger voltages may be applied across middle transistors 160, 162 and differential transistor 170, so special high-voltage transistors may be needed to prevent transistor damage.

Longer channel lengths and specialized physical layouts may be used to improve the voltage tolerance of the transistors, but this improvement is often insufficient for the higher voltages needed for a particular application. Often specialized high-voltage-tolerant transistors must be fabricated. Special fabrication steps may be added to a standard low-voltage semiconductor process to build these high-voltage transistors.

For example, middle transistors 160, 162 may be n-channel transistors with a thicker gate oxide while high-voltage transistors 150, 152 are p-channel transistors with the thicker gate oxide, while differential transistors 170, 172 are standard n-channel transistors with standard thin gate oxides.

An additional mask may be used to define which transistors have the thick oxide and which transistors have the thin oxide. A field oxide may be etched by this mask and then the thick gate oxides grown in these etched openings. Later the thin oxides may be grown for the standard transistors using existing standard fabrication steps. The additional mask, etch, and thick gate oxide growth steps increases the cost and complexity of the fabrication process when the high-voltage transistors are needed.

Another way to manufacture high-voltage transistors uses a lateral diffusion under the transistor gate. FIG. 2 is a cross-section of a Lateral-Diffusion Metal-Oxide-Semiconductor (LDMOS) transistor. LDMOS may be considered a variation of Double-Diffused MOS, which uses up to three ion implantation sequences to produce the drift region's doping profile that can withstand high electric fields.

A standard-thickness gate oxide separates gate 318 from the silicon substrate 326. Conducting channel 302 can form under gate 318 to allow current to flow from source S and N+ source diffusion 314 to drain D and N+ drain diffusion 316. P-well 322 is biased by P+ tap 312 that is also connected to source S.

In a traditional transistor, P-well 322 extends under all portions of gate 318. However, in LDMOS, additional N-type dopant is applied under N+ drain diffusion 316, such as by deep ion implantation before or when N+ drain diffusion 316 is formed. This deep N-type dopant then diffuses in all directions when heated, forming N-drift diffusion 324. This N-type dopant also diffuses into the channel region under gate 318, forming N-drift region 304 underneath a portion of gate 318.

The effective channel length $D_{CHAN}$ of conduction channel 302 is reduced by the drift length $D_{DRIFT}$ of N-drift region 304. This shorter effective channel length provides for higher frequency operation.

Also, the lateral doping profile provides for a higher drain-to-source breakdown voltage. N+ drain diffusion 316 is separated from P-well 322 by N-drift region 304, which provides a lower-doped PN (P− to N−) junction that will have a higher breakdown voltage than a higher-doped PN+ (P− to N+) junction when N-drift region 304 is missing. The lower-doped PN junction will have a higher resistance that carries a larger portion of the voltage drop that otherwise would be carried by the channel.

While LDMOS is useful for fabricating high-voltage transistors, additional processing steps still need to be added to a standard CMOS process. The deep N− implant is added for LDMOS, and possibly an extra heating (anneal) step. Thus LDMOS increases fabrication cost.

Power inefficiency and slow response speeds can occur in some level-shift circuits, and fabricating several kinds of high-voltage transistors can increase costs. High currents may occur when no current limiters are present.

What is desired is a high-speed level shifter circuit that does not require more than one kind of high-voltage transistor. A level shifter with only standard low-voltage transistors and n-channel LDMOS is desired that has a low propagation delay so it can operate at a high frequency. A level shifter with transient-response inputs and limited currents is desired to reduce power consumption.

DETAILED DESCRIPTION

The present invention relates to an improvement in level-shifter circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 3:
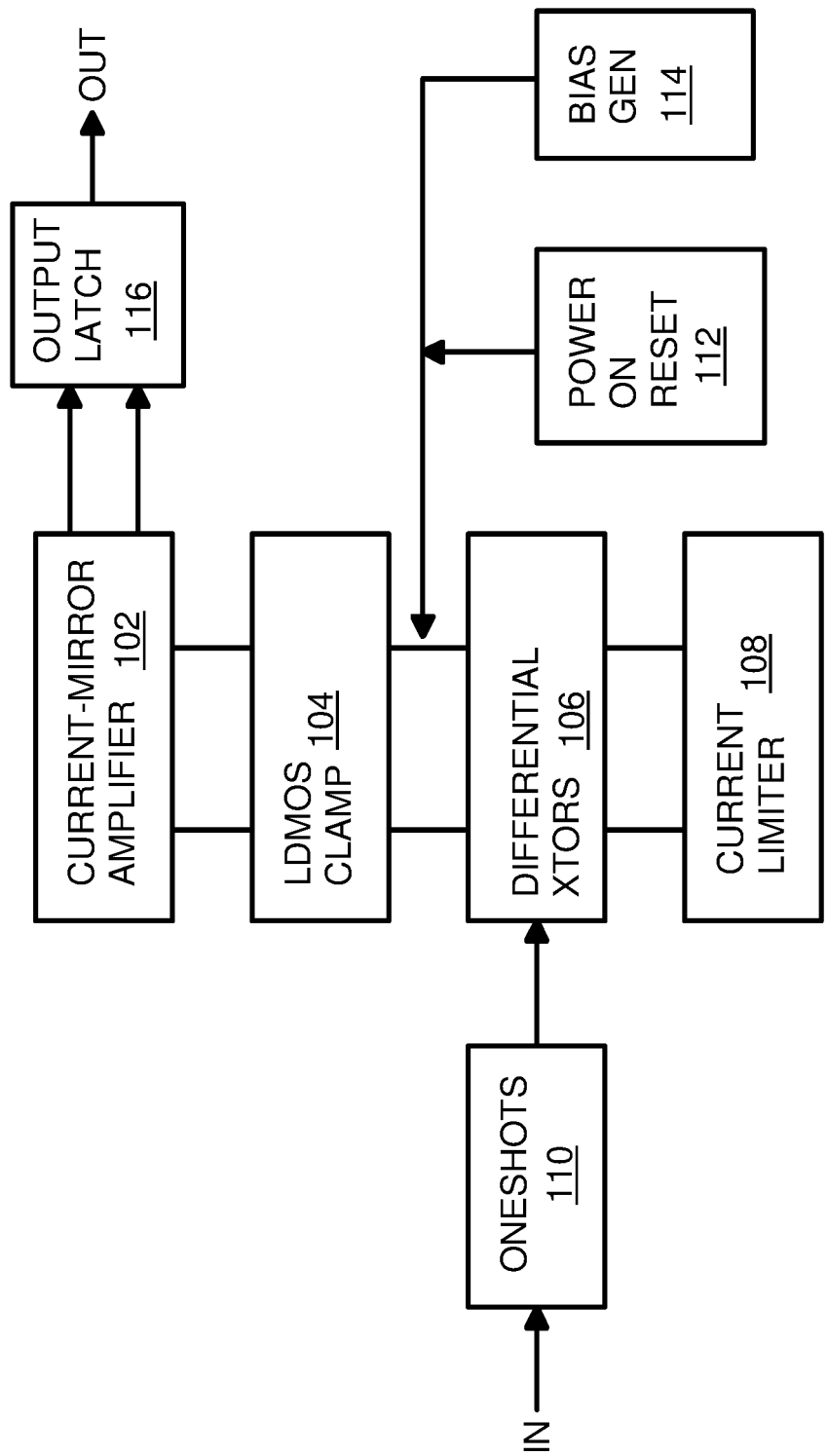
FIG. 3 is a block diagram of an edge-triggered level shifter with LDMOS clamp transistors.

FIG. 3 is a block diagram of an edge-triggered level shifter with LDMOS clamp transistors. An input IN in the low-voltage domain is level shifted to generate output OUT in the high voltage domain. For example, the low-voltage domain may have a high logic level of 3 volts and ground for the low logic level, while the high-voltage domain may have 15 volts as the logical high level and 12 volts as the logical low level.

Oneshots 110 are edge-triggered pulse generators that generate a pulse when IN changes state. These pulses are applied to gates of differential transistors 106 to shift current among two circuit legs. Current limiter 108 limits the tail current through differential transistors 106.

Differential transistors 106 shift current among the two circuit legs to generate a voltage difference among two nodes that are clamped by LDMOS clamp 104. LDMOS clamp 104 uses n-channel transistors that have a lateral diffusion to provide a higher drain-to-source breakdown voltage, so LDMOS clamp 104 can support a larger voltage difference across its transistor channels than can ordinary n-channel transistors used in differential transistors 106.

Current-mirror amplifier 102 uses standard p-channel transistors that have low drain-to-source breakdown voltages. However, LDMOS clamp 104 reduces the voltages applied to these p-channel transistors in current-mirror amplifier 102.

Thus the only specialized high-voltage transistors used by the level shifter are the LDMOS n-channel transistors in LDMOS clamp 104. Standard p-channel transistors are used in current-mirror amplifier 102, while standard n-channel transistors are used in differential transistors 106.

Oneshots 110 and output latch 116 may use standard p-channel and standard n-channel transistors. Output latch 116 is a bistable that latches the output generated from current-mirror amplifier 102 after oneshots 110 trigger the pulse. Output latch 116 holds the output state after the pulse generated by oneshots 110 ends.

Bias generator 114 generates a bias for the two circuit-leg nodes between differential transistors 106 and LDMOS clamp 104. Differential transistors 106 generate a large current than this bias when triggered by the pulse from oneshots 110, but after the pulse ends, differential transistors 106 turn off to save power and bias generator 114 drives a smaller transistor to hold the voltage difference across the two circuit-leg nodes.

Power-on reset generator 112 allows the level shifter circuit to power up to a stable state. The bias current from bias generator 114 may require time during power initialization to become stable, so power-on reset generator 112 initializes an internal node while the bias generator is ramping up current.

Power-on reset generator 112 and bias generator 114 can used standard low-voltage n-channel transistors. High-voltage transistors are not needed.

Figure 4:
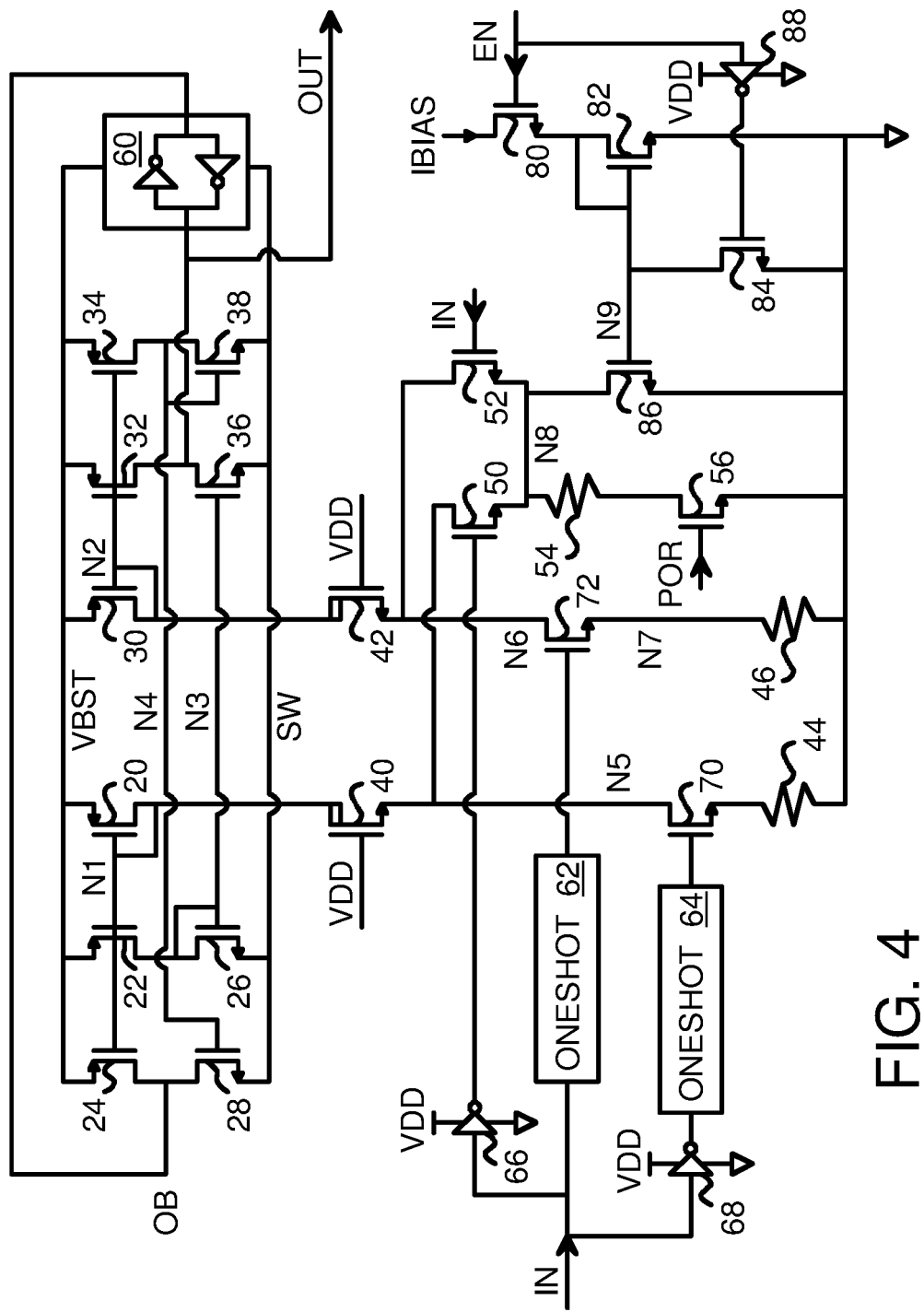
FIG. 4 is a schematic of an edge-triggered level shifter with LDMOS clamp transistors.

FIG. 4 is a schematic of an edge-triggered level shifter with LDMOS clamp transistors. When IN transitions from low to high, oneshot 62 generates a high-going pulse of short duration that turns on transient differential transistor 72 to allow current to flow through resistor 46 to ground from node N6. IN is applied to the gate of holding differential transistor 52 which allows current to flow from node N6 through bias transistor 86 to ground to keep node N6 low after the pulse ends and transient differential transistor 72 turns off. Holding differential transistor 50 and transient differential transistor 70 remain off when IN is high, allowing node N5 to float high through LDMOS transistor 40.

When IN transitions high to low, inverter 68 activates oneshot 64 to generate a high pulse of short duration to transient differential transistor 70, allowing node N5 to be pulled lower by current that is limited by resistor 44. Inverter 66 drives a high to the gate of holding differential transistor 50 to hold node N5 low after the pulse ends. Holding differential transistors 50, 52 can be smaller than transient differential transistors 70, 72 so that a larger current is provided initially by transient differential transistor 70 or 72, and then a smaller holding current is provided by holding differential transistor 50 or 52.

LDMOS transistors 40, 42 act as a clamp to prevent the upper high-voltage supply, boosted voltage VBST, from applying a high voltage onto the low-voltage n-channel transistors such as transient differential transistors 70, 72, holding differential transistors 50, 52, and bias transistor 86. LDMOS transistors 40, 42 have a higher breakdown voltage that is provided by the lateral diffusion under the gate that has a lower doping concentration than the N+ source. The gates of LDMOS transistors 40, 42 are driven by the low-voltage upper supply VDD.

When IN goes high, transient differential transistor 72 turns on driving node N6 lower than node N5. LDMOS transistor 42 pulls more current than LDMOS transistor 40 due to its lower source voltage N6, so node N2 on the drain of LDMOS transistor 42 is pulled lower than node N1 on the drain of LDMOS transistor 40, and this lower N2 voltage on the gate and drain of p-channel sensing transistor 30 increases its current flow to compensate. The lower N2 voltage is also applied to the gates of p-channel mirror transistors 32, 34, which draw more current, pulling their drains OUT and node N4, respectively, higher. The higher current through p-channel mirror transistor 34 causes node N4 to go higher, which is the gate and drain of n-channel mirror transistor 38. This higher N4 voltage is applied to the gate of n-channel output transistor 28, increasing its current drive and pulling node OB lower. The lower OB and the higher OUT are applied to opposite sides of output latch 60, which is bistable and pulls OUT closer to the upper high supply, VBST and pulls OB closer to the lower high supply SW.

When IN goes low and node N5 is pulled lower by transient differential transistor 70, LDMOS transistor 40 drives node N1 lower than node N2. This lower N1 voltage on the gate and drain of p-channel sensing transistor 20 increases its current flow to compensate. The lower N1 voltage is also applied to the gates of p-channel mirror transistors 22, 24, which draw more current, pulling their drains, node N3 and OB, respectively, higher. The higher current through p-channel mirror transistor 22 causes node N3 to go higher, which is the gate and drain of n-channel mirror transistor 26. This higher N3 voltage is applied to the gate of n-channel output transistor 36, increasing its current drive and pulling output node OUT lower. The lower OUT and the higher OB are applied to opposite sides of output latch 60, which is bistable and pulls OB closer to the upper high supply, VBST and pulls OUT closer to the lower high supply SW.

Rather than be a constant voltage, SW can have a varying voltage that still acts as the lower high-voltage supply terminal. For example, VBST can be a constant 15 volts, while SW switches above 10 volts so that VBST-SW is less than 5 volts to protect low-voltage transistors.

A bias current is set by the gate voltage to bias transistor 86. This gate voltage on node N9 is generated by the gate and drain of n-channel transistor 82. When enable EN is high and applied to the gate of n-channel transistor 80, bias current IBAS flows through n-channel transistors 80, 82, generating a bias voltage on node N9. When EN is low, inverter 88 drives a high to the gate of disable transistor 84 to drive node N9 to ground, which turns off bias transistor 86.

During initialization, IBIAS may not yet be stable. Power-On-Reset POR is high during power initialization, turning on n-channel transistor 56, which holds node N8 low through resistor 54. Once POR goes low, transistor 56 turns off and bias transistor 86 pulls a steady bias current from node N8.

Figure 5:
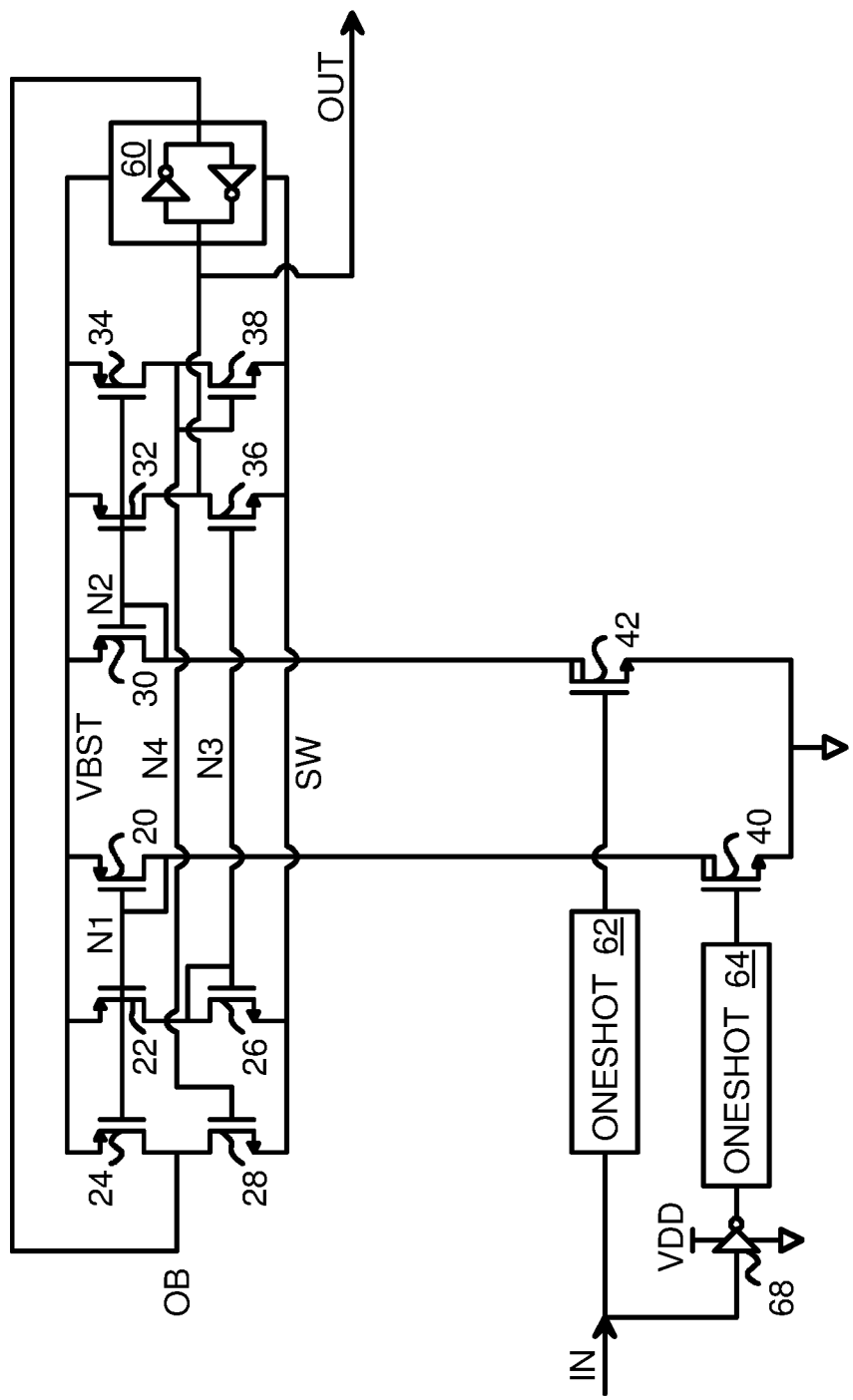
FIG. 5 is an alternative of the transient level shifter.

FIG. 5 is an alternative of the transient level shifter. In this alternative, oneshot 62 drives the gate of LDMOS transistor 42 directly. The gate of LDMOS transistor 40 is driven by oneshot 64 which generates a pulse when IN goes low and inverter 68 drives a high to the input of oneshot 64. The sources of LDMOS transistors 40, 42 are grounded. Advantages of this alternative include a simpler circuit to implement and no DC power consumption. However, the transition current depends on the ON-resistance of LDMOS transistors 40, 42 which are sensitive to process variation. Since LDMOS transistors 40, 42 are turned off after the one-shot pulse period, only output latch 60 holds the data. Output latch 60 can be noise sensitive without an additional biasing circuit to hold the data. Without POR, OUT is not well-defined before IN settles during power up.

Figure 6:
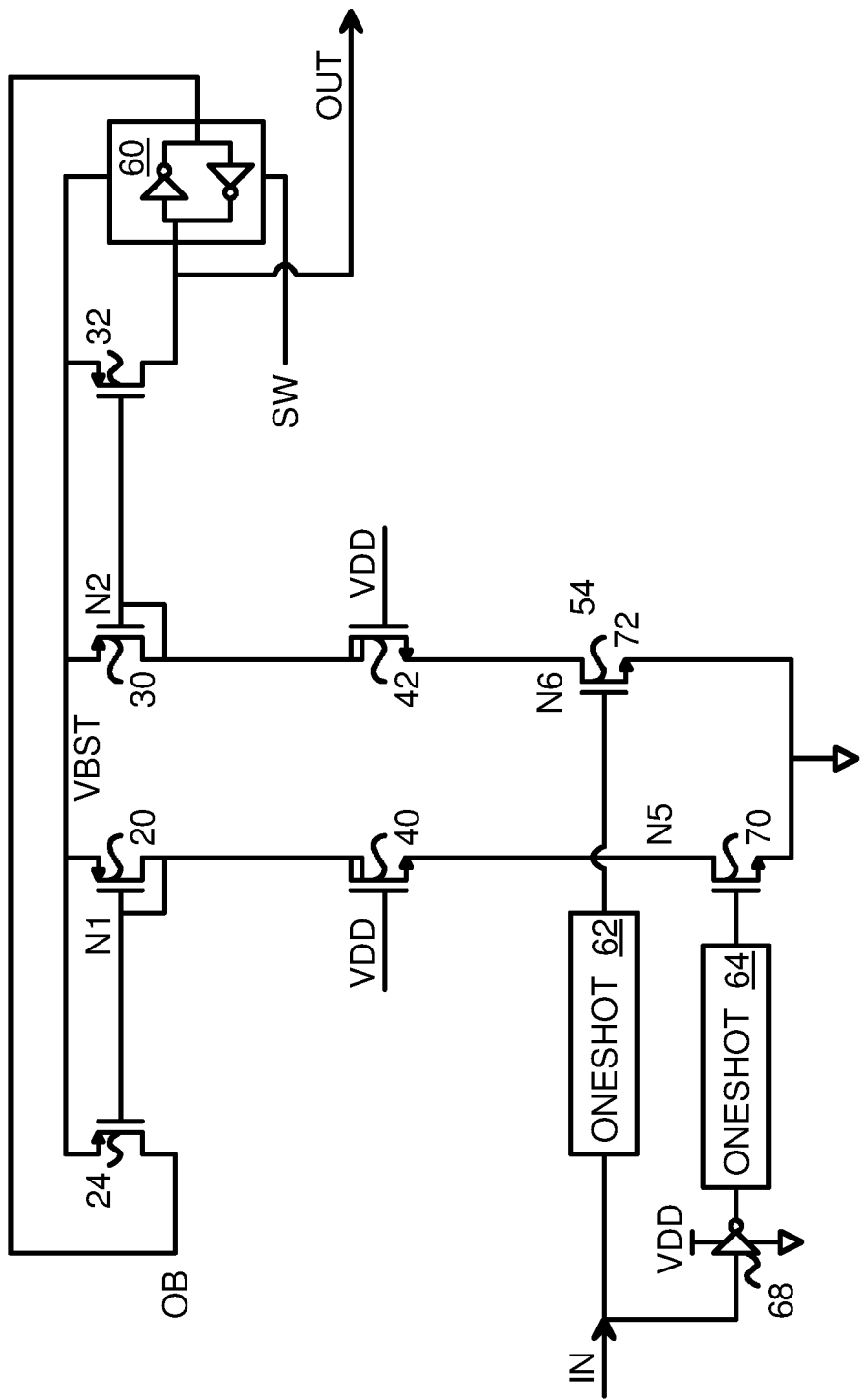
FIG. 6 is another alternative of the transient level shifter.

FIG. 6 is another alternative of the transient level shifter. In this alternative the current mirror is simplified. P-channel sensing transistor 20 has its gate and drain connected together at node N1 which is mirrored to the gate of p-channel mirror transistor 24 which drives node OB at its drain. P-channel sensing transistor 30 has its gate and drain connected together at node N2 which is mirrored to the gate of p-channel mirror transistor 34 which drives node OUT at its drain. Output latch 60 helps to more rapidly drive a small voltage difference on OUT, OB to the upper rails VBST and SW.

Node N1 is the drain of LDMOS transistor 40, while the source of LDMOS transistor 40 is node N5, which is driven to ground by transient differential transistor 70 when oneshot 64 is triggered by IN going low through inverter 68. The current limiting resistors 44, 46 have been eliminated as well as holding differential transistors 50, 52, and the bias and reset circuits.

In this alternative output latch 60 will hold the state after the pulses from oneshots 62, 64 end. The circuit may be less stable during power on reset and a longer pulse duration may be required.

Advantages of this alternative include a simpler circuit to implement and no DC power consumption. However, the transition current depends on the ON-resistance of LDMOS transistors 40, 42 and differential transistors 70, 72 which are sensitive to process variation. Since differential transistors 70, 72 are turned off after the one-shot pulse period, only output latch 60 holds the data. Output latch 60 can be noise sensitive without an additional biasing circuit to hold the data. Without POR, OUT is not well-defined before IN settles during power up. Also without sink current paths of n-channel mirror transistor 26, n-channel output transistors 28, 36, and n-channel mirror transistor 38, the transition speed of output latch 60 may be slower.

Figure 7:
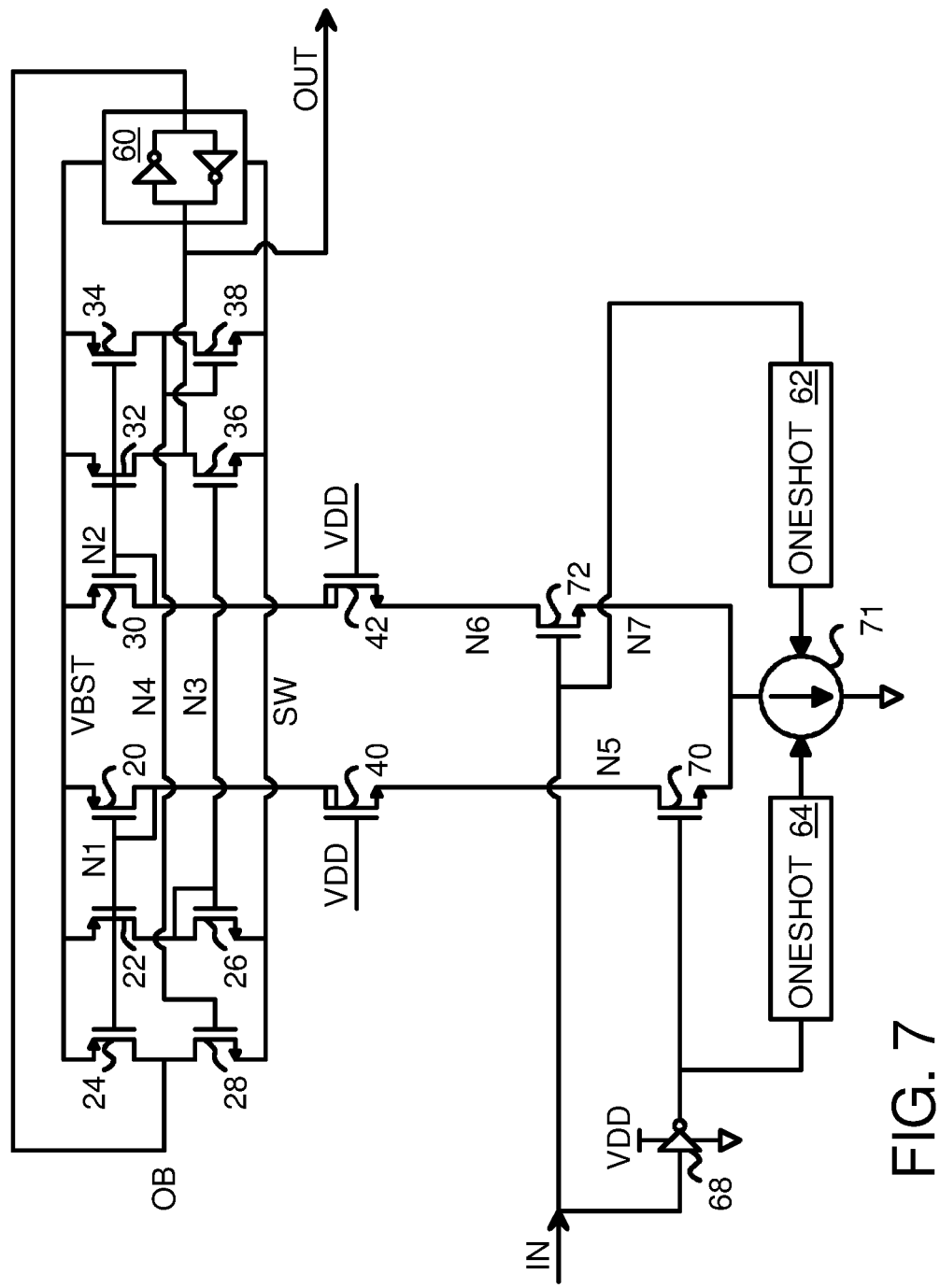
FIG. 7 is another alternative of the transient level shifter.

FIG. 7 is another alternative of the transient level shifter. In this alternative oneshots 62, 64 turn on current sink 71 for the short period of time of the generated pulse. When IN goes high, oneshot 62 is activated to turn on current sink 71 and IN is applied to the gate of transient differential transistor 72 to turn it on to connect LDMOS transistor 42 to current sink 71.

When IN goes low, inverter 68 triggers oneshot 64 to turn on current sink 71. Inverter 68 drives high the gate of transient differential transistor 70 to turn it on to connect LDMOS transistor 40 to current sink 71. This alternative circuit has better control of the transition current and no DC power consumption. Since differential transistors 70, 72 are turned off after the one-shot pulse period, only output latch 60 holds the data. Output latch 60 can be noise sensitive without an additional biasing circuit to hold the data. Without POR, OUT is not well-defined before IN settles during power up.

Figure 8:
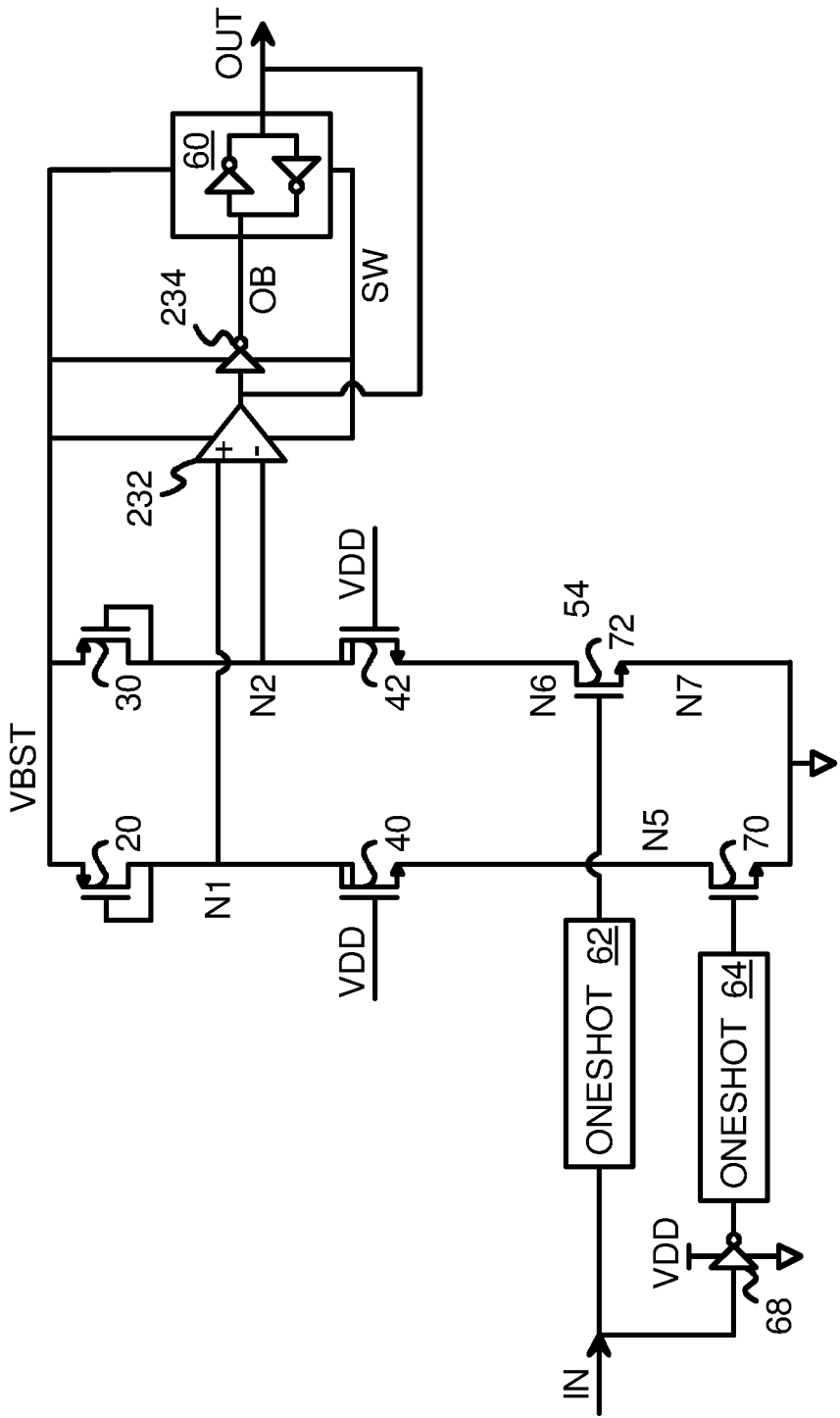
FIG. 8 is still another alternative of the transient level shifter.

FIG. 8 is still another alternative of the transient level shifter. In this alternative p-channel sensing transistor 20 has its gate and drain connected together at node N1 which is applied to the non-inverting (+) input of comparator 232, while the non-inverting (−) input of comparator 232 is node N2 from the gate and drain of p-channel sensing transistor 30. The output of comparator 232 is output OUT, which is applied to output latch 60 to rapidly settle the output. Inverter 234 inverts comparator 232 output OUT to drive OB into output latch 60

Node N1 is the drain of LDMOS transistor 40, while the source of LDMOS transistor 40 is node N5, which is driven to ground by transient differential transistor 70 when oneshot 64 is triggered by IN going low through inverter 68. The current limiting resistors 44, 46 have been eliminated as well as holding differential transistors 50, 52, and the bias and reset circuits.

In this alternative output latch 60 will hold the state after the pulses from oneshots 62, 64 end. The circuit may be less stable during power on reset and a longer pulse duration may be required. Advantages of this alternative include a simpler circuit to implement and no DC power consumption. However, the transition current depends on the ON-resistance of LDMOS transistors 40, 42 and differential transistors 70, 72 which are sensitive to process variation. Since differential transistors 70, 72 are turned off after the one-shot pulse period, only output latch 60 holds the data. Output latch 60 can be noise sensitive without an additional biasing circuit to hold the data. Without POR, OUT is not well-defined before IN settles during power up.

Figure 9:
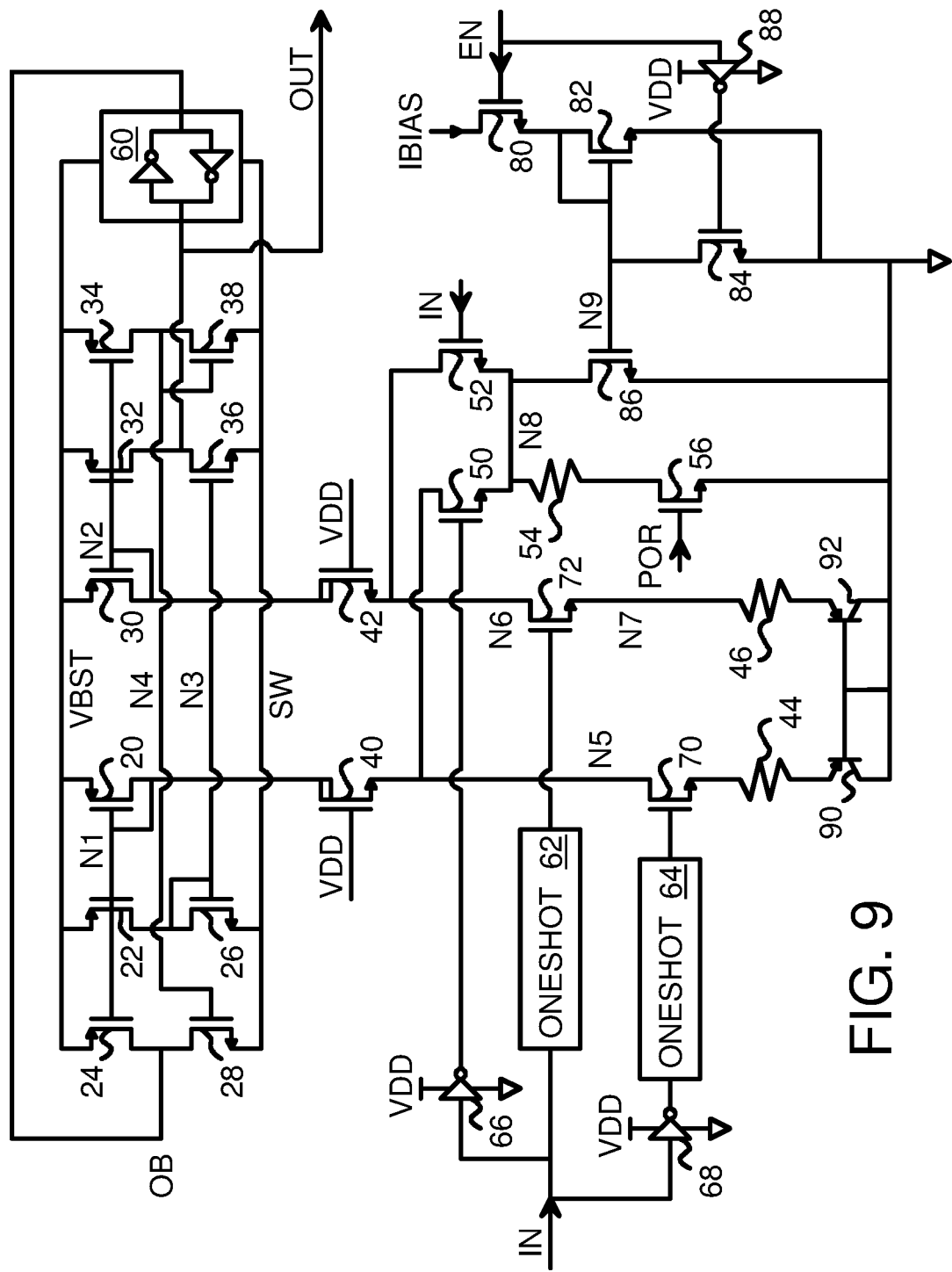
FIG. 9 is an alternative of the transient level shifter with bipolar compensating transistors.

FIG. 9 is an alternative of the transient level shifter with bipolar compensating transistors. In this alternative PNP transistor 90 has its emitter connected to the lower terminal of current limiting resistor 44 while PNP transistor 92 has its emitter connected to the lower terminal of current limiting resistor 46. The bases of PNP transistors 90, 92 are connected together and to ground.

PNP transistors 90, 92 allow for temperature, voltage, and process compensation that may be superior to using limiting resistors 44, 46 (FIG. 3). Compensation for different frequency bands of operation may also be provided. Temperature compensation is provided by the positive temperature coefficient of a polysilicon resistor. The negative temperature coefficient of the base-emitter junction can cancel out the temperature drift of the polysilicon resistor. However the die area may increase due to addition of the Bipolar Junction Transistors (BJT) and reduction of the driving strength of LDMOS transistors 40, 42 and differential transistors 70, 72.

Figure 10:
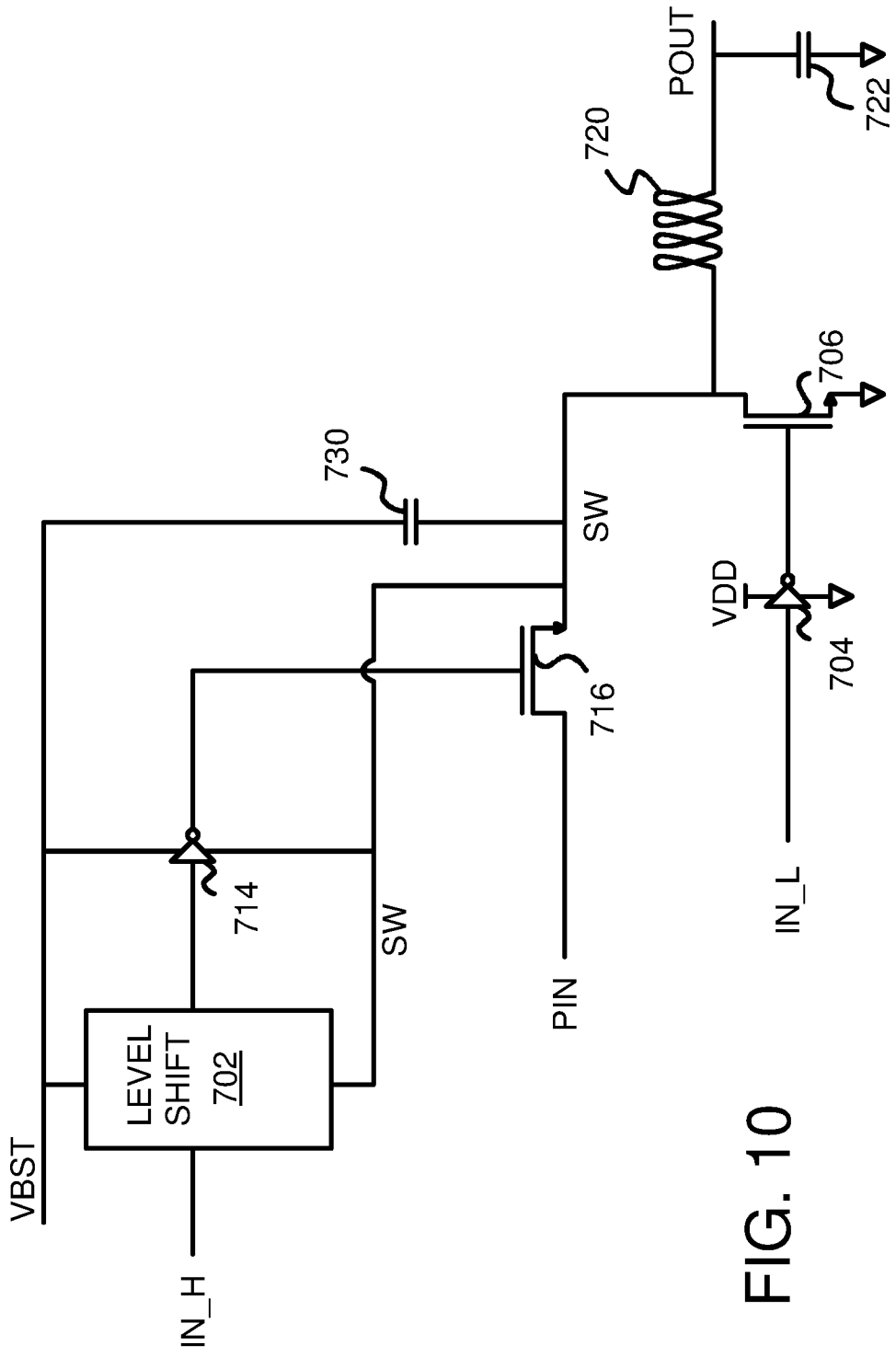
FIG. 10 shows a level-shifter within a Buck converter.

FIG. 10 shows a level-shifter within a Buck converter. Level shifter 702 can be any of the level shifters of FIGS. 3-9 or other variants. The switch-control input IN_L drives the gate of pull-down driver transistor 706 through buffer 704, which is powered by the low-voltage power supply VDD and connects to ground. Switch-control input IN_H is shifted by level-shifter 702 to drive the input of buffer 714 which drives the gate of pull-up driver transistor 716. IN_H and IN_L can be non-overlapping to prevent power spikes and their timing adjusted to obtain a desired output POUT, such as when PIN is an AC signal.

Level-shifter 702 and buffer 714 are powered by the boosted power-supply voltage VBST. Level-shifter 702 and buffer 714 have their lower supply terminals connected to node SW, which is the node between pull-up driver transistor 716 and pull-down driver transistor 706, which can be filtered by inductor 720 and capacitor 722 to generate the switched-power output POUT from the Buck converter. The Buck converter input PIN is applied to the drain of pull-up driver transistor 716 while the source of pull-down driver transistor 706 is ground. Boost capacitor 730 can be connected between node SW and VBST.

The internal node of the Buck converter between the driver transistors, node SW, can be used as the lower supply terminal SW to level-shifter 702 and buffer 714. This node SW acts as a floating ground to level-shifter 702 and buffer 714. Pull-down driver transistor 706 and pull-up driver transistor 716 can be large n-channel transistors. For a buck converter, VBST and SW can both have varying voltages such that VBST-SW<5V by using a bootstrap circuit.

Although output OUT from current-mirror amplifier 102 (FIG. 3) in level-shifter 702 has a high voltage, node SW acts as a floating ground that rises above ground when OUT goes high to turn on pull-up driver transistor 716, which drives SW higher. Thus a lower voltage is applied across transistors in current-mirror amplifier 102 that if SW were replaced with a fixed ground. This allows for standard p-channel and n-channel transistors to be used in current-mirror amplifier 102 despite the high OUT voltage.

Using standard low-voltage n-channel and p-channel transistors and only having two high-voltage transistors, LDMOS transistors 40, 42, can reduce cost and complexity and improve circuit speed. Oneshots provide for an edge-triggered or transient response that can lower power consumption. The bias circuit prevents noise disturbance once the pulse from the oneshot ends. Tail resistors or transistors provide current limitation for safety and to prevent circuit damage. The current mirror amplifier prevent undershoot on falling edges of the output signals, improves circuit speed, and limit voltage swings.

Alternate Embodiments

Several other embodiments are contemplated by the inventors. For example many combinations and variations of the level-shifter circuit alternatives in FIGS. 4-9 may be substituted. Some embodiments may not use power-on reset generator 112 or bias generator 114. Other biasing or holding mechanisms may be used in place of bias transistor 86 and holding differential transistors 50, 52, such as leaker resistors. Transistors may be used as resistors to limit current in some embodiments. Capacitors may be transistors with source and drains connected together as one terminal of the capacitor, and the gate as the other terminal.

The level shifter provides a good propagation delay and reduced standby current due to its transient triggering using the oneshots. A oneshot may be constructed from a logic gate such as a NAND, NOR, AND, OR, XOR gate that has one input delayed by a string of inverters while the other gate input is direct with no delay. The delay through the string of inverters determines the pulse width. Other circuits for oneshots may be substituted.

While a Buck converter has been shown, other kinds of circuits for high-voltage applications could be substituted, such as source-followers, common-source amplifiers, class-B amplifiers, class AB amplifiers, etc. The technique can apply to all high-voltage circuits (analog or logic) that use LDMOS and can't withstand full high-voltage swing signals.

Figure 1:
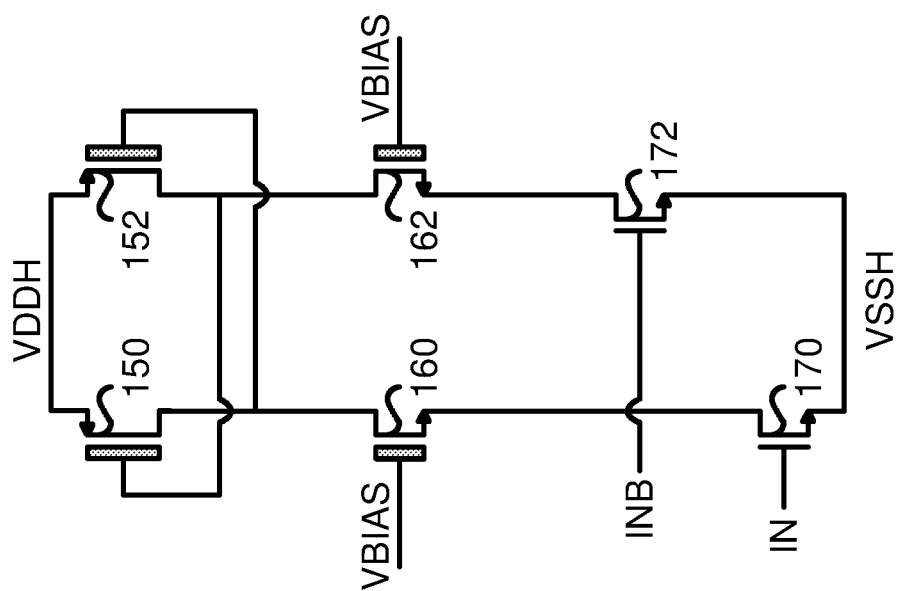
FIG. 1 shows a prior-art level shifter.
Figure 2:
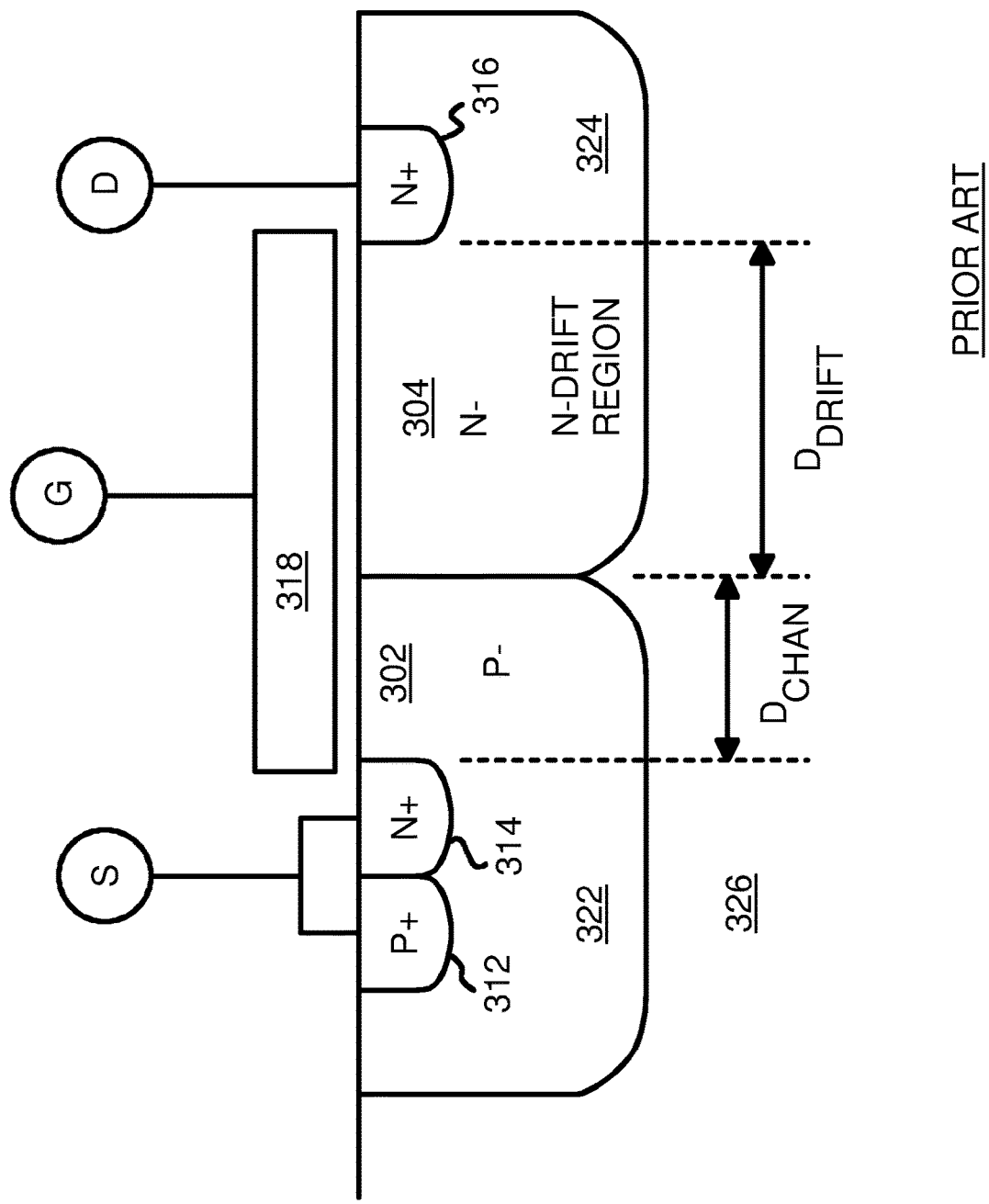
FIG. 2 is a cross-section of a Lateral-Diffusion Metal-Oxide-Semiconductor (LDMOS) transistor.

LDMOS transistors 40, 42 can be n-channel transistors with a higher source-drain breakdown voltage than other n-channel transistors, such as transient differential transistors 70, 72, holding differential transistors 50, 52, bias transistor 86, and other n-channel transistors in the Power-on-reset and bias circuits. LDMOS transistors 40, 42 have a higher breakdown voltage due to the added lateral diffusion that creates N-drift region 304 between N+ drain diffusion 316 and conduction channel 302 (FIG. 2). This added lateral diffusion adds one or more processing steps and is not used for standard n-channel transistors that have the lower breakdown voltage, making these standard n-channel transistors low-voltage transistors while LDMOS transistors 40, 42 can be considered high-voltage transistors.

The p-channel transistors in conduction channel current-mirror amplifier 102 can be standard p-channel transistors that do not have an added lateral diffusion to create a P-drift region under the gates. Thus these standard p-channel transistors can be considered to be low-voltage transistors. The n-channel transistors in current-mirror amplifier 102 also can be standard n-channel transistors without N-drift region 304 and with a small drain-source breakdown voltage. Thus current-mirror amplifier 102 uses low-voltage p-channel and n-channel transistors.

Although output OUT from current-mirror amplifier 102 has a high voltage, node SW acts as a floating ground that rises above ground when OUT goes high to turn on pull-up driver transistor 716, which drives SW higher. Thus a lower voltage is applied across transistors in current-mirror amplifier 102 that if SW were replaced with a fixed ground.

Additional process steps may be added, such as to provide a thicker gate oxide for LDMOS transistors 40, 42, or to other transistors, for better gate-to-source breakdown voltages. Long-term reliability may be enhanced by the process steps. Various physical layouts may be used to enhance resistance to high voltage, such as using doughnut transistor layouts, increased spacings, longer gate lengths, etc. Gates may be polysilicon or other materials. Some process enhancements may be added to all standard transistors, such as adjusting drain doping profiles to reduce the sharpness of the source-to-well junctions. These process enhancements may be needed for the standard transistors just to have sufficient breakdown voltages for the low-voltage VDD supply, especially for smaller device sizes, but these enhancements are insufficient for higher voltages such as VBST.

The boosted power supply VBST could be an externally-generated voltage, or could be generated by a voltage booster circuit, a charge pump, or by other circuits. Different values of VBST, VDD, and SW could be substituted. Using a boosted voltage from the level shifter allows for a smaller pull-up transistor to be used in the Buck converter. While VDD has been shown as the bias voltage to the gates of LDMOS transistors 40, 42, a different fixed voltage may be substituted, or a variable voltage used.

More complex buffers, level shifters, or other components could be substituted or added. Inversions could be added at various locations. Hysteresis of other delays and output wave shaping could be added. Rather than use CMOS inverters, other kinds of buffer circuits, selectors, or muxes may be used.

Different transistor, capacitor, resistor, and other device sizes can be used, and various layout arrangements can be used, such as multi-leg, ring, doughnut or irregular-shape transistors. Currents can be positive or negative currents and flow in either direction. Many second and third order circuit effects may be present and may be significant, especially for smaller device sizes. A circuit simulation may be used to account for these secondary factors during design.

Devices may be implemented using n-channel, p-channel, or bipolar transistors, or junctions within these transistors. The gate lengths and spacings can be increased to provide better protection from damage.

Many variations of IC semiconductor manufacturing processes are possible. Various materials may be used. Additional process steps may be added, such as for additional metal layers or for other transistor types or modification of standard complementary metal-oxide-semiconductor (CMOS) transistors when the transistors are integrated onto a larger device. While complementary metal-oxide-semiconductor (CMOS) transistors have been described, other kinds of transistors could be substituted for some embodiments, such as n-channel only, p-channel only when the output swing can be limited, or various alternate transistor technologies such as Bipolar or BiCMOS. The CMOS process may be a Fin Field-Effect Transistor (FinFET) process.

Terms such as up, down, above, under, horizontal, vertical, inside, outside, are relative and depend on the viewpoint and are not meant to limit the invention to a particular perspective. Devices may be rotated so that vertical is horizontal and horizontal is vertical, so these terms are viewer dependent.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A level shifter comprising:
a switch-control input;
a first oneshot for generating a first pulse in response to a falling-edge transition of the switch-control input;
a second oneshot for generating a second pulse in response to a rising-edge transition of the switch-control input;
a first transient differential transistor, having a gate receiving the first pulse and a drain connected to a first node;
a first voltage-tolerant transistor having a gate driven by a gate bias voltage and a source connected to the first node and a drain connected to a third node;
a first sensing transistor having a gate and a drain connected to the third node and a source connected to a boosted node;
a second transient differential transistor, having a gate receiving the second pulse and a drain connected to a second node;
a second voltage-tolerant transistor having a gate driven by the gate bias voltage and a source connected to the second node and a drain connected to a fourth node;
a second sensing transistor having a gate and a drain connected to the fourth node and a source connected to the boosted node;
an upper buffer for buffering the third node to generate an inverted output, and for buffering the fourth node to generate an output; and
a bistable latch receiving the output and receiving the inverted output, the bistable latch for latching the output and the inverted output;
wherein the upper buffer and the bistable latch are each powered by the boosted node and has a floating ground node;
wherein the first transient differential transistor and the second transient differential transistor are each an n-channel transistor having a standard-n source-drain breakdown voltage;
wherein the first sensing transistor and the second sensing transistor are each a p-channel transistor having a standard-p source-drain breakdown voltage;

wherein the first voltage-tolerant transistor and the second voltage-tolerant transistor are each an enhanced n-channel transistor fabricated to have an enhanced source-drain breakdown voltage that is greater than the standard-n source-drain breakdown voltage, whereby voltage-tolerant enhanced transistors are placed between the upper buffer and the first and second transient differential transistors.

2. The level shifter of claim 1 wherein the upper buffer further comprises:
a comparator receiving the third node and receiving the fourth node one complementary inputs, the comparator generating the output and the inverted output as complementary outputs to the bistable latch.

3. The level shifter of claim 1 wherein the upper buffer further comprises:
a first p-channel output transistor, having a gate receiving the third node and a source connected to the boosted node, with a drain driving the inverted output;
a second p-channel output transistor, having a gate receiving the fourth node and a source connected to the boosted node, with a drain driving the output.

4. The level shifter of claim 3 wherein the upper buffer further comprises:
a first p-channel mirror transistor, having a gate receiving the third node and a source connected to the boosted node, with a drain driving a first mirror node;
a second p-channel mirror transistor, having a gate receiving the fourth node and a source connected to the boosted node, with a drain driving a second mirror node;
a first n-channel mirror transistor, having a gate and a drain driving the first mirror node, and a source connected to the floating ground node;
a second n-channel mirror transistor, having a gate and a drain driving the second mirror node, and a source connected to the floating ground node;
a first n-channel cross-coupled transistor, having a gate receiving the second mirror node, and a drain driving the inverted output, and a source connected to the floating ground node; and
a second n-channel cross-coupled transistor, having a gate receiving the first mirror node, and a drain driving the output, and a source connected to the floating ground node.

5. The level shifter of claim 4 wherein all n-channel transistors in the upper buffer are n-channel transistors having the standard-n source-drain breakdown voltage;
wherein all p-channel transistors in the upper buffer are p-channel transistors having the standard-p source-drain breakdown voltage.

6. The level shifter of claim 5 further comprising:
a first resistor connected between a source of the first transient differential transistor and a ground;
a second resistor connected between a source of the second transient differential transistor and the ground.

7. The level shifter of claim 5 further comprising:
a first PNP transistor having an emitter connected to a source of the first transient differential transistor, and having a base and a collector connected to a ground;
a second PNP transistor having an emitter connected to a source of the second transient differential transistor, and having a base and a collector connected to the ground.

8. The level shifter of claim 5 further comprising:
a first n-channel holding differential transistor having a drain connected to the first node and a gate connected to the switch-control input, and a source connected to a tail node;
a second n-channel holding differential transistor having a drain connected to the second node and a gate connected to an inverse of the switch-control input, and a source connected to the tail node;
an n-channel bias transistor having a drain connected to the tail node, a source connected to a ground, and a gate receiving a bias voltage.

9. The level shifter of claim 8 further comprising:
a bias-voltage generator for generating the bias voltage;
a power-on reset generator for biasing the tail node during initialization of power when the bias-voltage generator is powering up.

10. The level shifter of claim 5 wherein the gate bias voltage is a lower power supply voltage, wherein the lower power supply voltage is applied to the gate of the first voltage-tolerant transistor and to the gate of the second voltage-tolerant transistor, wherein the first oneshot and the second oneshot are powered by the lower power supply voltage.

11. The level shifter of claim 5 wherein the first voltage-tolerant transistor and the second voltage-tolerant transistor each comprise a Lateral-Diffusion Metal-Oxide-Semiconductor (LDMOS) having an N-drift region formed by a lateral diffusion process step;
wherein the N-drift region is formed under a transistor gate and between a source and a conduction channel under the transistor gate;
wherein the N-drift region is not present in n-channel transistors having the standard-n source-drain breakdown voltage;
wherein the N-drift region provides the enhanced source-drain breakdown voltage that is greater than the standard-n source-drain breakdown voltage.

12. The level shifter of claim 5 further comprising:
an n-channel pull-up driver transistor having a gate controlled by the output from the bistable latch, and having a drain connected to a power-converter input and a source connected to the floating ground node;
an n-channel pull-down driver transistor having a gate controlled by the switch-control input and a drain connected to the floating ground node and a source connected to ground;
a filter connected between the floating ground node and a power-converter output;
whereby the floating ground node to the upper buffer is generated between the n-channel pull-up driver transistor and the n-channel pull-down driver transistor in a power converter.

13. A transient-response level shifter comprising:
a first oneshot for generating a first pulse in response to a falling-edge transition of a switch-control input;
a second oneshot for generating a second pulse in response to a rising-edge transition of the switch-control input;
a first voltage-tolerant transistor having a gate driven by the first pulse from the first oneshot and a source connected to a first node and a drain connected to a third node;
a first sensing transistor having a gate and a drain connected to the third node and a source connected to a boosted node;

a second voltage-tolerant transistor having a gate driven by the second pulse from the second oneshot and a source connected to a second node and a drain connected to a fourth node;

a second sensing transistor having a gate and a drain connected to the fourth node and a source connected to the boosted node;

a first p-channel output transistor, having a gate receiving the third node and a source connected to the boosted node, with a drain driving an inverted output;

a second p-channel output transistor, having a gate receiving the fourth node and a source connected to the boosted node, with a drain driving an output;

a first p-channel mirror transistor, having a gate receiving the third node and a source connected to the boosted node, with a drain driving a first mirror node;

a second p-channel mirror transistor, having a gate receiving the fourth node and a source connected to the boosted node, with a drain driving a second mirror node;

a first n-channel mirror transistor, having a gate and a drain driving the first mirror node, and a source connected to a floating ground node;

a second n-channel mirror transistor, having a gate and a drain driving the second mirror node, and a source connected to the floating ground node;

a first n-channel cross-coupled transistor, having a gate receiving the second mirror node, and a drain driving the inverted output, and a source connected to the floating ground node;

a second n-channel cross-coupled transistor, having a gate receiving the first mirror node, and a drain driving the output, and a source connected to the floating ground node;

a bistable latch receiving the output and receiving the inverted output, the bistable latch for latching the output and the inverted output;

wherein the bistable latch is each powered by the boosted node and the floating ground node.

14. The transient-response level shifter of claim 13 wherein the first n-channel mirror transistor, the second n-channel mirror transistor, the first n-channel cross-coupled transistor, and the second n-channel cross-coupled transistor are each a standard n-channel transistor having a standard-n source-drain breakdown voltage;

wherein the first sensing transistor, the second sensing transistor, the first p-channel output transistor, the second p-channel output transistor, the first p-channel mirror transistor, and the second p-channel mirror transistor are each a p-channel transistor having a standard-p source-drain breakdown voltage;

wherein the first voltage-tolerant transistor and the second voltage-tolerant transistor are each an enhanced n-channel transistor fabricated to have an enhanced source-drain breakdown voltage that is greater than the standard-n source-drain breakdown voltage;

wherein an absolute value of the standard-p source-drain breakdown voltage is smaller than the enhanced source-drain breakdown voltage.

15. The transient-response level shifter of claim 14 wherein the first voltage-tolerant transistor and the second voltage-tolerant transistor each comprise a Lateral-Diffusion Metal-Oxide-Semiconductor (LDMOS) having an N-drift region formed by a lateral diffusion process step;

wherein the N-drift region is formed under a transistor gate and between a source and a conduction channel under the transistor gate;

wherein the N-drift region is not present in n-channel transistors having the standard-n source-drain breakdown voltage;

wherein the N-drift region provides the enhanced source-drain breakdown voltage that is greater than the standard-n source-drain breakdown voltage.

16. The transient-response level shifter of claim 13 wherein the first node and the second node are connected to a ground.

17. A voltage-tolerant level shifter comprising:

a first oneshot for generating a first pulse in response to a falling-edge transition of a switch-control input;

a second oneshot for generating a second pulse in response to a rising-edge transition of the switch-control input;

a first differential transistor, having a gate receiving an inverse of the switch-control input and a drain connected to a first node and a source connected to a bottom node;

a first voltage-tolerant transistor having a gate driven by a fixed voltage and a source connected to the first node and a drain connected to a third node;

a first sensing transistor having a gate and a drain connected to the third node and a source connected to a boosted node;

a second differential transistor, having a gate receiving the switch-control input and a drain connected to a second node and a source connected to the bottom node;

a second voltage-tolerant transistor having a gate driven by a fixed voltage and a source connected to the second node and a drain connected to a fourth node;

a second sensing transistor having a gate and a drain connected to the fourth node and a source connected to the boosted node;

a first p-channel output transistor, having a gate receiving the third node and a source connected to the boosted node, with a drain driving an inverted output;

a second p-channel output transistor, having a gate receiving the fourth node and a source connected to the boosted node, with a drain driving an output;

a first p-channel mirror transistor, having a gate receiving the third node and a source connected to the boosted node, with a drain driving a first mirror node;

a second p-channel mirror transistor, having a gate receiving the fourth node and a source connected to the boosted node, with a drain driving a second mirror node;

a first n-channel mirror transistor, having a gate and a drain driving the first mirror node, and a source connected to a floating ground node;

a second n-channel mirror transistor, having a gate and a drain driving the second mirror node, and a source connected to the floating ground node;

a first n-channel cross-coupled transistor, having a gate receiving the second mirror node, and a drain driving the inverted output, and a source connected to the floating ground node;

a second n-channel cross-coupled transistor, having a gate receiving the first mirror node, and a drain driving the output, and a source connected to the floating ground node;

a bistable latch receiving the output and receiving the inverted output, the bistable latch for latching the output and the inverted output;

wherein the bistable latch is each powered by the boosted node and the floating ground node; and a current sink coupled between the bottom node and a ground, the current sink receiving the first pulse and receiving the second pulse, the current sink conducting current in response to the first pulse and in response to the second pulse.

18. The voltage-tolerant level shifter of claim 17 wherein the first differential transistor, the second differential transistor, the first n-channel mirror transistor, the second n-channel mirror transistor, the first n-channel cross-coupled transistor, and the second n-channel cross-coupled transistor are each a standard n-channel transistor having a standard-n source-drain breakdown voltage;

wherein the first sensing transistor, the second sensing transistor, the first p-channel output transistor, the second p-channel output transistor, the first p-channel mirror transistor, and the second p-channel mirror transistor are each a p-channel transistor having a standard-p source-drain breakdown voltage;

wherein the first voltage-tolerant transistor and the second voltage-tolerant transistor are each an enhanced n-channel transistor fabricated to have an enhanced source-drain breakdown voltage that is greater than the standard-n source-drain breakdown voltage;

wherein an absolute value of the standard-p source-drain breakdown voltage is smaller than the enhanced source-drain breakdown voltage.

19. The voltage-tolerant level shifter of claim 18 wherein the first voltage-tolerant transistor and the second voltage-tolerant transistor each comprise a Lateral-Diffusion Metal-Oxide-Semiconductor (LDMOS) having an N-drift region formed by a lateral diffusion process step;

wherein the N-drift region is formed under a transistor gate and between a source and a conduction channel under the transistor gate;

wherein the N-drift region is not present in n-channel transistors having the standard-n source-drain breakdown voltage;

wherein the N-drift region provides the enhanced source-drain breakdown voltage that is greater than the standard-n source-drain breakdown voltage.

20. The voltage-tolerant level shifter of claim 19 wherein the fixed voltage is a low-voltage power supply voltage.

\* \* \* \* \*